United States Patent [19]
Ohmori

[11] Patent Number: 6,100,583
[45] Date of Patent: Aug. 8, 2000

[54] SEMICONDUCTOR DEVICE CONTAINING SEMICONDUCTOR ELEMENT IN PACKAGE

[75] Inventor: Makoto Ohmori, Tokyo, Japan

[73] Assignee: NEC Corporation, Tokyo, Japan

[21] Appl. No.: 09/256,360

[22] Filed: Feb. 24, 1999

[30] Foreign Application Priority Data

Feb. 27, 1998 [JP] Japan ................................ 10-047805

[51] Int. Cl.⁷ .................... H01L 23/053; H01L 23/48; H01L 23/12; H05K 7/20
[52] U.S. Cl. .................... 257/704; 257/710; 257/728; 257/729; 257/702; 257/432; 257/669; 257/528; 257/532
[58] Field of Search .................... 257/736, 704, 257/680, 702, 710, 728, 729, 774, 432, 528, 532, 669

[56] References Cited

U.S. PATENT DOCUMENTS

| | | | |
|---|---|---|---|
| 4,630,172 | 12/1986 | Stenerson et al. | 361/718 |
| 4,868,638 | 9/1989 | Hirata et al. | 257/697 |
| 5,067,007 | 11/1991 | Otsuka et al. | 257/701 |
| 5,414,214 | 5/1995 | Cho et al. | 174/52.3 |
| 5,534,725 | 7/1996 | Hur | 257/434 |
| 5,777,383 | 7/1998 | Stager et al. | 257/700 |
| 5,821,532 | 10/1998 | Beaman et al. | 250/239 |
| 5,901,046 | 5/1999 | Ohta et al. | 361/760 |
| 5,923,958 | 7/1999 | Chou | 438/118 |
| 5,932,875 | 8/1999 | Chung et al. | 257/433 |
| 5,945,834 | 8/1999 | Nakata et al. | 324/754 |

FOREIGN PATENT DOCUMENTS 62-145748  6/1987  Japan .

Primary Examiner—Alexander O. Williams
Attorney, Agent, or Firm—Sughrue, Mion, Zinn, Macpeak & Seas, PLLC

[57] ABSTRACT

A semiconductor element such as a CCD chip is contained in a recess portion of an opaque package made of plastic, and the upper surface thereof is covered with a transparent cap made of plastic. The cap has a different thermal expansion coefficient from that of the package and is formed in a thickness of 0.5 mm which is thinner than that of the prior art. The semiconductor element is connected with leads and these leads project outside the package. This semiconductor device is mounted to a printed circuit board.

27 Claims, 9 Drawing Sheets

SEMICONDUCTOR DEVICE CONTAINING SEMICONDUCTOR ELEMENT IN PACKAGE

BACKGROUND OF THE INVENTION

1. Field of the Invention

The present invention relates to a semiconductor device, and more particularly to a semiconductor device containing a CCD chip.

2. Description of the Related Art

Heretofore, a semiconductor device has been known in the art wherein a ceramic package thereof has a recess portion in which a semiconductor element such as a CCD (Charge Couple Device) chip is contained, and the recess portion is covered with a cap. The portion of the cap that is bonded to the package is usually made of ceramic, metal or the like, while the portion of the cap facing to the CCD chip is made of transparent glass, in consideration of a case in which the CCD chip is used as imaging means or optical sensors. Although a semiconductor device having such a construction exhibits a high strength since the package and the cap are made of ceramic or glass, the device has a drawback of an increased manufacturing cost.

On the other hand, Japanese Patent Laid-open No.145748/87 discloses a semiconductor device whose package is made of a plastic. The manufacturing cost of this construction is lower than that of the construction in which the package is made of ceramic.

Thus, in the disclosed semiconductor device, reduction in cost may be achieved by forming the package from a plastic. However, since glass must be inserted in the cap in order to allow light to be incident on the CCD chip, an increase in cost results. Therefore, from the viewpoint of reduction in cost, it is desirable that the package and cap of the semiconductor device are made of plastic and glass rather than ceramic and glass, and it is more desirable that all portions are exclusively made of a plastic.

However, there is a problem in manufacture when package 11 and cap 15 of a semiconductor device are exclusively made of a plastic as shown in FIGS. 1A, 1B and 1C. In general, a semiconductor device is mounted on printed circuit board 14 for use. As shown in FIG. 1B, leads 13 of the semiconductor device is inserted into though holes 14a of printed circuit board 14, and immersed into molten solder bath 16 at a high temperature and then they are cooled, thereby solidifying solders 16a to cause the semiconductor device to be fixed to printed circuit board 14. In such a so-called flowing process, heating and cooling are performed while the semiconductor device is mounted on printed circuit board 14. At this time, if the thermal expansion coefficients are different between the semiconductor device and printed circuit board 14, then the magnitudes of expansion and contraction are different between the semiconductor device and printed circuit board 14, thereby causing warp as shown in FIG. 1C. In particular, after solder 16a is cooled and solidified (when the temperature is equal to or lower than the eutectic temperature 183° C.), the semiconductor device and printed circuit board 14 will contract at different rates while both are fixed at the portions of leads 13 so that an unnatural deformation occurs and a large warp is generated.

When the semiconductor device having the warp generated in this way is used as a sensor for reading images in a scanner or as imaging means, the error is large, and therefore the accuracy is deteriorated.

SUMMARY OF THE INVENTION

It is an object of the present invention to provide a semiconductor device whose package and cap are exclusively made of a plastic in order to reduce the manufacturing cost and whose warp is small when it is mounted to a printed circuit board.

According to one aspect of the present invention, a semiconductor device comprises an opaque package made of a plastic with a recess portion on the upper surface thereof, a semiconductor element contained in the recess portion, and a transparent cap made of a plastic and fixed to the upper surface of the package to cover the recess portion, characterized in that the thickness of the cap is 0.5 mm or less. Thus, an apparent thermal expansion coefficient of the entire semiconductor device including the package and the cap can be made smaller so that it is close to the thermal expansion coefficient of a normal printed circuit board, and the warp of the semiconductor device can therefore be suppressed.

According to one aspect of the present invention, the transparent cap has groove portions formed in a direction substantially vertical to the longitudinal direction. In this case, the force tending to deform the semiconductor device will be concentrated on the groove portions to warp the cap in the longitudinal direction does not act so strongly, thereby reducing the amount of the warp in the longitudinal direction.

According to one aspect of the present invention, the transparent cap has provided with a projection outside the recess portion, and the projection is bonded to the upper surface of the package and has a ring shape surrounding the outside of the recess portion. In this case, since the only path conducting the heat from the package to the cap is the projection, and the heat is not easily conducted to the cap, the temperature of the cap is unable to rise as high as that of the package thereby reducing the amount of deformation and the warp on the side of the cap.

According to one aspect of the present invention, the semiconductor device comprises an opaque package made of plastic and a recess portion formed on the upper surface, a semiconductor element contained in the recess portion, and a cap made of plastic and fixed to the upper surface of the package to cover the recess portion, the cap being formed of a transparent portion at a position facing to the semiconductor element in the recess portion and an opaque portion at a position other than the transparent portion. In this case, the thermal expansion coefficient of the entire semiconductor device including the package and the cap can be closer to the thermal expansion coefficient of a normal printed circuit board. In addition, an apparent thermal expansion coefficient of the entire semiconductor device is reduced, so that the warp of the semiconductor device can be suppressed.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 2A:
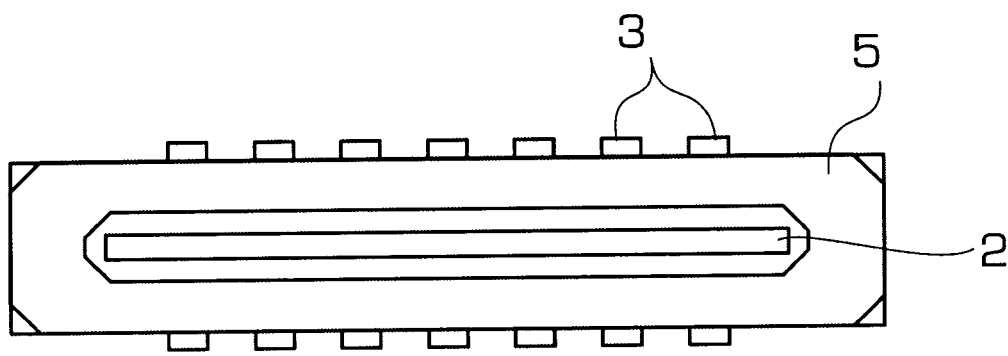
FIG. 2A is a plan view showing a first embodiment according to the present invention.
Figure 2B:
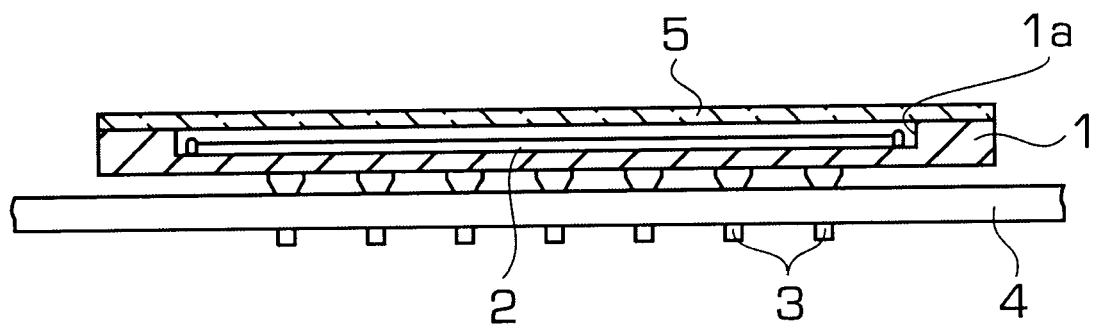
FIG. 2B is a front sectional view showing the first embodiment according to the present invention.

Referring now to FIGS. 2A and 2B, there is shown a basic construction of a semiconductor device of a first embodiment according to the present invention. This semiconductor device comprises a package 1 having a recess portion 1a, a CCD chip (charge-coupled device) 2 which is an example of a semiconductor element contained in the recess portion 1a, a plurality of metal leads 3 connected to CCD chip 2 and extending toward the outside of the package 1, and a cap 5 bonded to the surface on which the recess portion of package 1 is formed to cover the recess portion. This semiconductor device is mounted on printed circuit board 4 and used as a sensor for reading manuscripts in a facsimile, a copy machine or the like.

Figure 1A:
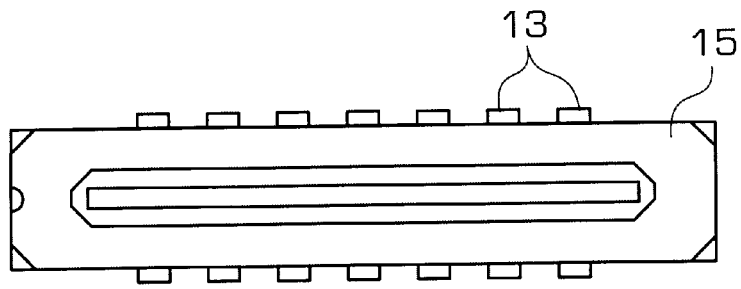
FIG. 1A is a plan view showing a prior art semiconductor device.
Figure 1B:
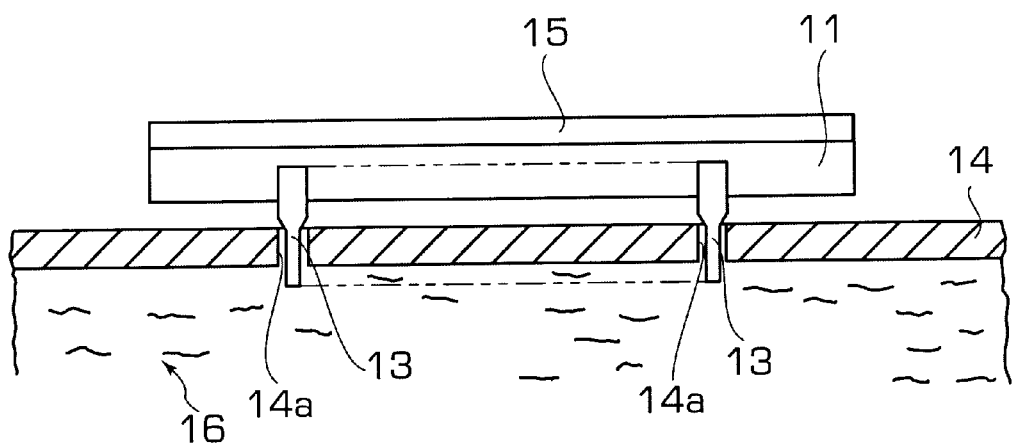
FIG. 1B is a front view showing the prior art semiconductor device during heating.
Figure 1C:
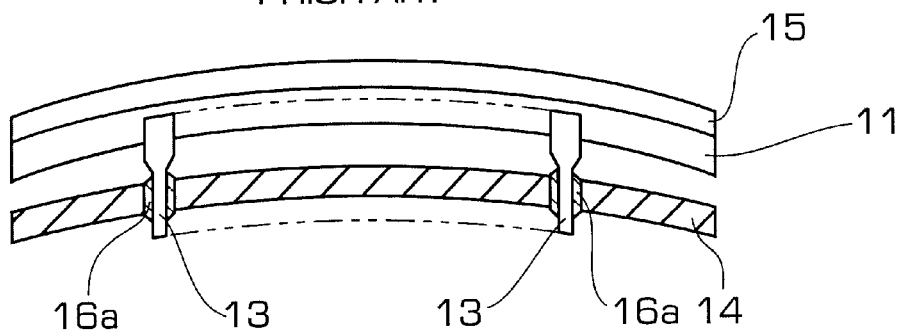
FIG. 1C is a front view showing the prior art semiconductor device after deformation.

As described above, when a conventional semiconductor device is mounted on the printed circuit board and is subjected to heating and cooling, the semiconductor warps due to the difference in the thermal expansion coefficients between the printed circuit board and the semiconductor device, as shown in FIG. 1C. In particular, a semiconductor device used as a sensor or the like generally has an elongated shape (its length may be approximately five times larger than its width for the entire semiconductor device and the semiconductor element may have a length in the longitudinal direction 47 times larger than the width), so that a great warp is easily generated in the longitudinal direction. The applicant has firstly considered factors of the warp in the conventional semiconductor device, as follows:

For suppressing the warp to be caused by heating and cooling of the semiconductor device mounted on the printed circuit board, it is believed that the thermal expansion coefficients of the printed circuit board and that of the semiconductor device are made substantially the same with each other to match the magnitudes of the expansion and contraction of the former to those of the latter. When ceramic or glass are used as materials for the package and the cap of the semiconductor device, a large warp is not easily generated since those materials have the thermal expansion coefficients close to those of the printed circuit board, but the device becomes costly. It is thus desirable to use the package and the cap made of plastic which is less expensive and also to make their thermal expansion coefficients close to that of the printed circuit board. It has therefore been carried out to mix an impurities such as filler or carbon into plastic, so that the thermal expansion coefficients of the package and the cap may be made close to those of the printed circuit board. However, when the semiconductor device is used as a sensor, the semiconductor element (CCD chip) must be exposed to light so that at least the portion of the cap facing to the CCD chip must be transparent and impurities such as filler or carbon to reduce the thermal expansion coefficient are not allowed to be mixed into plastic in that portion. Namely, the thermal expansion coefficient of the package of the semiconductor device can be made close to that of the printed circuit board, whereas the thermal expansion coefficient of the cap of the semiconductor device is difficult to be made close to that of the printed circuit board. Specifically, in the case of the thermal expansion coefficient of the printed circuit board being $16 \times 10^{-6}$ (/° C.), the thermal expansion coefficient of the package can be reduced to approximately $14 \times 10^{-6}$ (/° C.), while the thermal expansion coefficient of the cap is as low as $61 \times 10^{-6}$ (/° C.). Therefore, it can be seen that a great warp in the conventional semiconductor device is mainly due to its cap.

Referring to FIGS. 2A and 2B, in this embodiment, the thickness of the cap 5 is made 0.5 mm or less, which is thinner than that of the prior art. As a result, although the cap 5 in itself has the same thermal expansion coefficient as that of the prior art, the total of the force which tends to thermally deform the cap 5 is smaller corresponding to the reduced thickness of cap 5, thus exerting a smaller force on package 1. Specifically, even though the force of cap 5 to be deformed per unit volume is constant, the force of the total thermal deformation is smaller corresponding to the reduced thickness so that a smaller force acts on package 1. Therefore, the amount of the warp is smaller for the entire semiconductor device. Additionally, when package 1 is made of a plastic material with impurities added thereto at a certain rate and cap 5 is made exclusively of a plastic material, the rate of impurities in the plastic material is greater for the entire semiconductor device as the volume of cap 5 is smaller. Therefore, an apparent thermal expansion coefficient of the entire semiconductor device is small.

Figure 3:
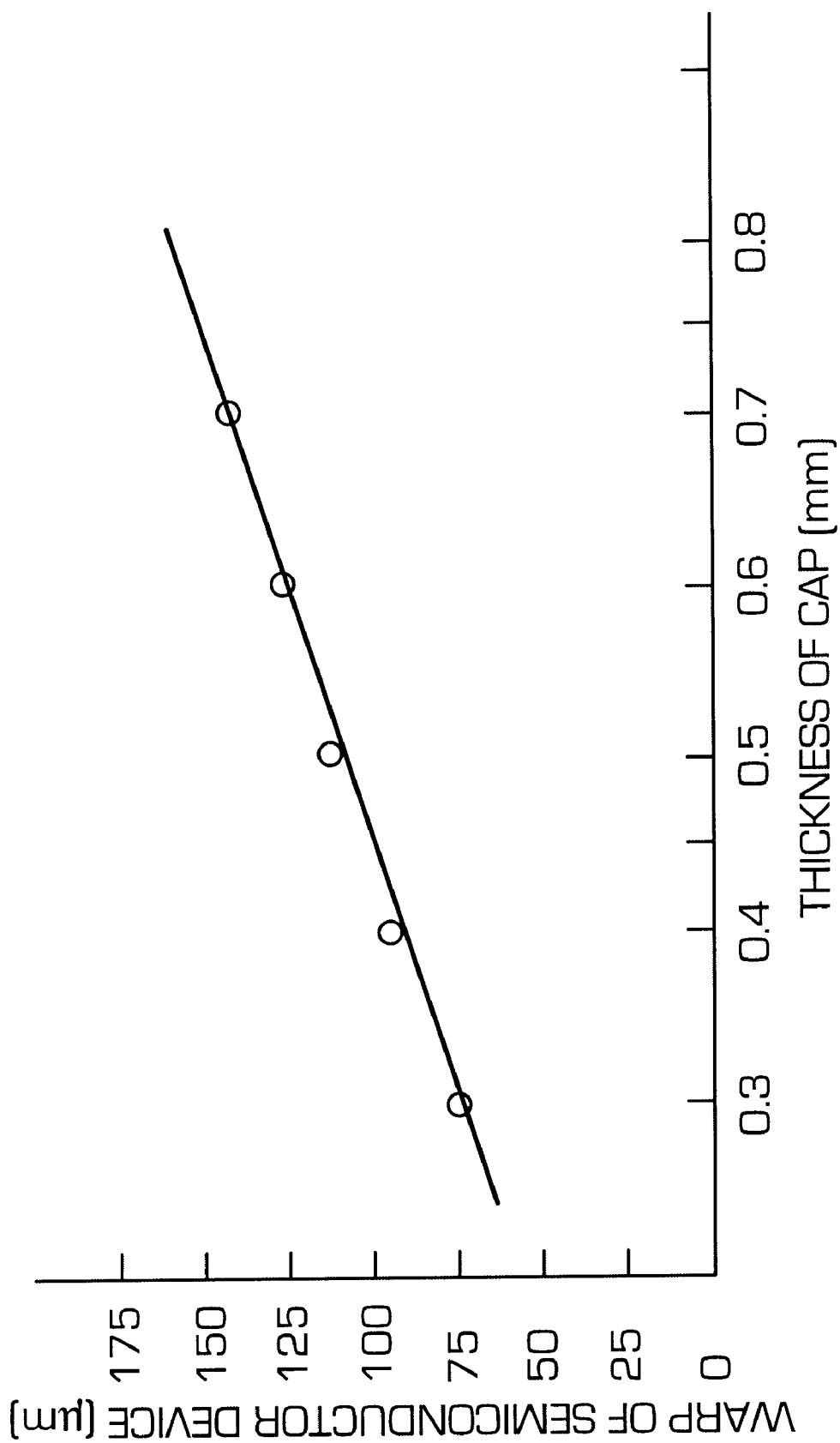
FIG. 3 is a graph showing the relationship between the thickness of a cap and the warp of a semiconductor device according to the first embodiment.

FIG. 3 shows a change in the amount of the warp of the semiconductor device versus the change in the thickness of the cap 5, which was obtained through an experiment performed by the applicant. If the thickness of package 1 is assumed to be 3.64 mm, then the amount of the warp is approximately 0.14 mm when cap 5 is 0.7 mm in thickness, and the rate of the warp is 0.14/(3.64+0.7)=0.322=3.22%. On the other hand, when cap 5 is 0.5 mm in thickness, the amount of the warp is approximately 0.11 mm and the rate of the warp is 0.11/(3.64+0.5)=0.265=2.65%. These results show that the thinner cap 5 is, the smaller the warp is. Furthermore, since the rate of the warp of approximately 2.65% is usually permissible under normal conditions for use of the semiconductor device, the thickness of cap 5 may preferably be 0.5 mm or less.

It should be noted that the construction of this embodiment is identical to that of the prior art except for cap 5.

Figure 4A:
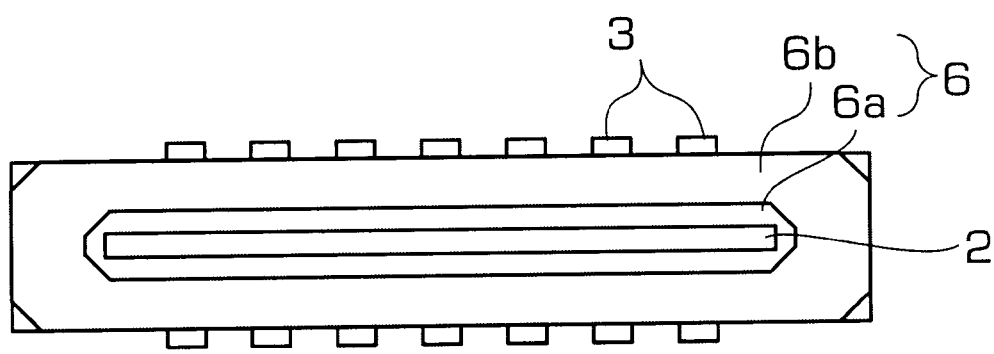
FIG. 4A is a plan view showing a second embodiment according to the present invention.
Figure 4B:
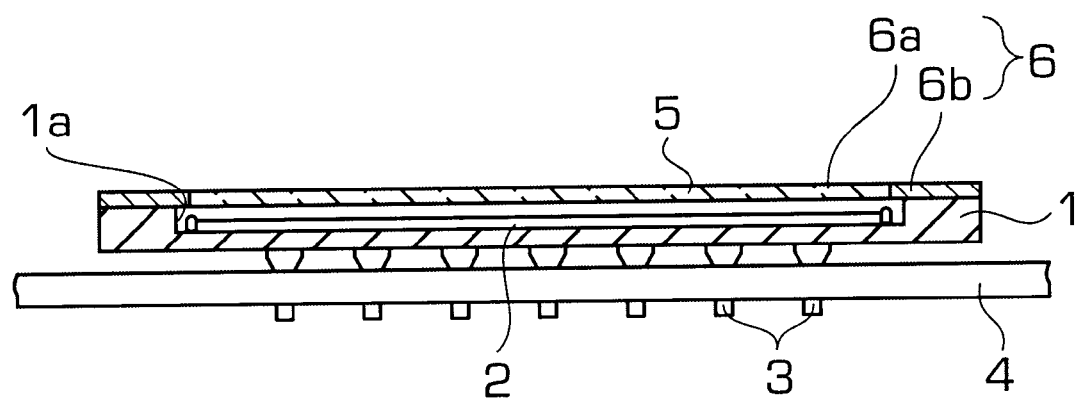
FIG. 4B is a front sectional view showing the second embodiment according to the present invention.

Referring to FIGS. 4A and 4B, there is shown a second embodiment according to the present invention in which the constructions of package 1, CCD chip 2, and leads 3 are identical to those of the prior art and those of the first embodiment.

Cap 6 in this embodiment consists of a transparent portion 6a facing to the CCD chip 2 and an opaque portion 6b which is the portion other than the transparent portion 6a. Like package 1, opaque portion 6b is made of plastic into which impurities such as filler or carbon are mixed and has a small thermal expansion coefficient. On the other hand, transparent portion 6a is made only of a plastic material without impurities mixed therein and has a large thermal expansion coefficient.

As with the first embodiment, since in this embodiment, the volume of the transparent portion 6a having a large thermal expansion coefficient is small, the total of the force to thermally deform the transparent portion 6a is also small and the force exerting on the package 1 is small. Furthermore, if the package 1 and the opaque portion 6b are both made of plastic materials with impurities included at the same rate, the smaller the rate of the impurities in the plastic material of the entire semiconductor device is, the larger the volume of transparent portion 6a. An apparent thermal expansion coefficient of the entire semiconductor device is thus smaller and closer to the thermal expansion coefficient of printed circuit board 4, and the amount of the warp of the semiconductor device is smaller. It should be noted that the thickness of transparent 6a is preferably thinner, particularly 0.5 mm or less.

Figure 5A:
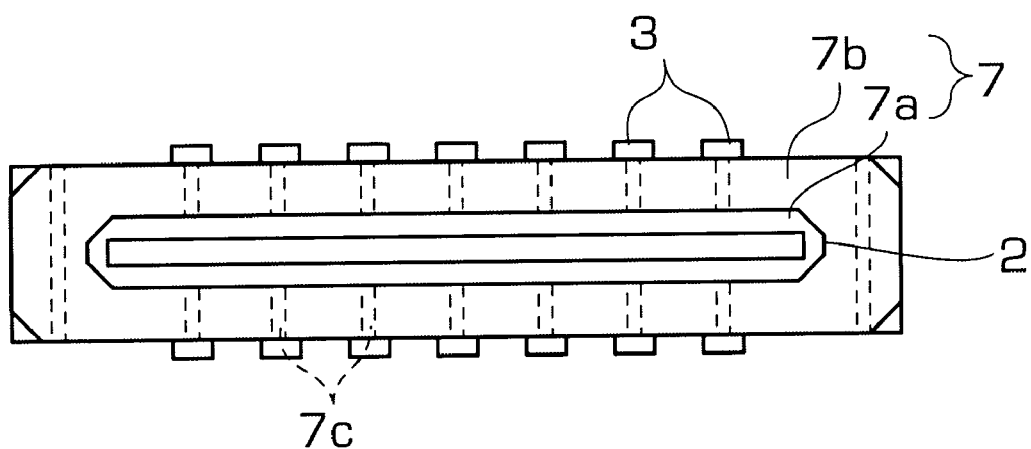
FIG. 5A is a plan view showing a third embodiment according to the present invention.
Figure 5B:
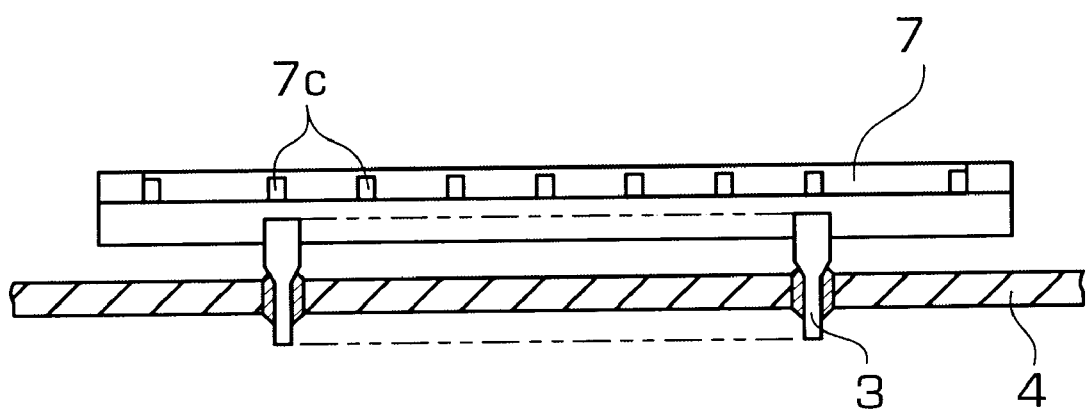
FIG. 5B is a front view showing the third embodiment according to the present invention.

Referring to FIGS. 5A and 5B, there is shown a third embodiment according to the present invention in which the constructions of package 1, CCD chip 2, and leads 3 are also identical to those of the prior art and those of the first and second embodiments.

Cap 7 in this embodiment consists of a transparent portion 7a at a position facing to the CCD chip 2 and an opaque portion 7b which is the portion other than the transparent portion 7a. Like package 1, the opaque portion 7b is made of a plastic material in which impurities such as filler or carbon are mixed and has a small thermal expansion coefficient. On the other hand, transparent portion 7a is made exclusively of a plastic material without impurities mixed therein and has a large thermal expansion coefficient. Cap 7 has an inner side surface (surface bonded to the package 1) on which a multiplicity of grooves 7c are formed extending in the traverse direction.

In this embodiment, since the force which tends to thermally deform the cap 7 by heat is concentrated on the grooves 7c, the entire warp is suppressed to a small amount. Specifically, in this embodiment, although the thermal expansion coefficient of the transparent portion 7a does not vary, the force which tends to thermally deform is concentrated on the grooves 7c so that the force which tends to warp the cap 7 in the longitudinal direction as in the prior art is small. Therefore, even though the partial deformation of the device at grooves 7c is large, the warp of the cap 7 and the entire semiconductor device in the longitudinal direction is suppressed.

Like the second embodiment, in this embodiment, the volume of transparent portion 7a having a large thermal expansion coefficient is small so that the total sum of the force to thermally deform the transparent portion 7a is small and the force exerted on the package 1 is small. Additionally, since the volume of transparent portion 7a is small, the rate of the impurities in the plastic material of the entire semiconductor device is large so that an apparent thermal expansion coefficient of the entire semiconductor device is smaller and closer to the thermal expansion coefficient of the printed circuit board 4. This is also because an amount of warp of the semiconductor device according to this embodiment is small.

Figure 6A:
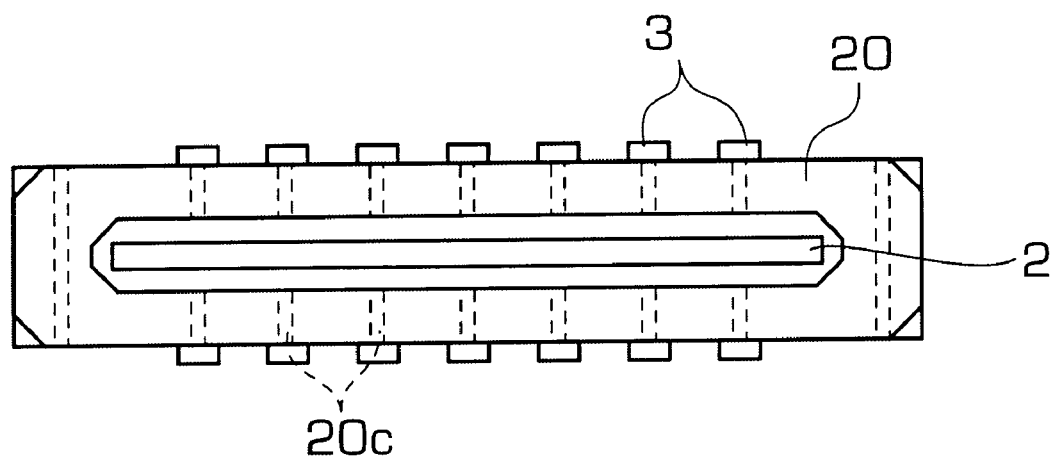
FIG. 6A is a plan view showing a variant of the third embodiment according to the present invention.
Figure 6B:
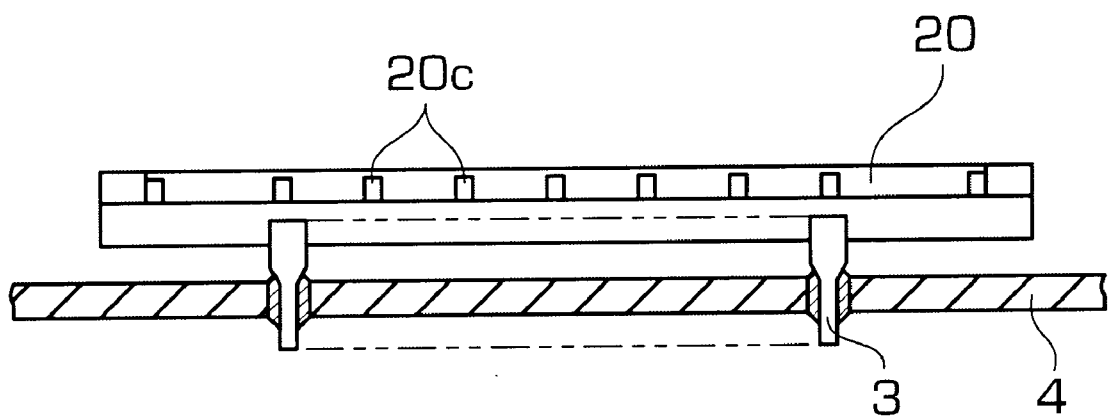
FIG. 6B is a front view showing the example of the variation of the third embodiment according to the present invention.

It should be noted that as shown in FIG. 6A and FIG. 6B, the effect of suppressing the warp of cap 7 and the entire semiconductor device in the longitudinal direction may also be obtained through the configuration in which grooves 20c are formed in entirely transparent cap 20.

Figure 7A:
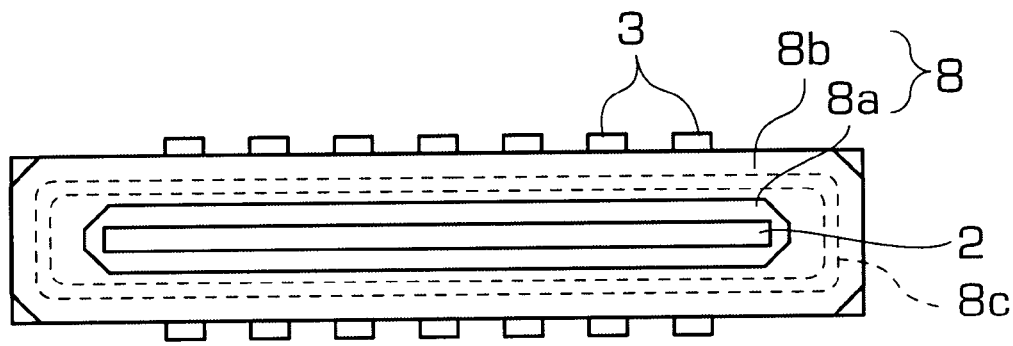
FIG. 7A is a plan view showing a fourth embodiment according to the present invention.
Figure 7B:
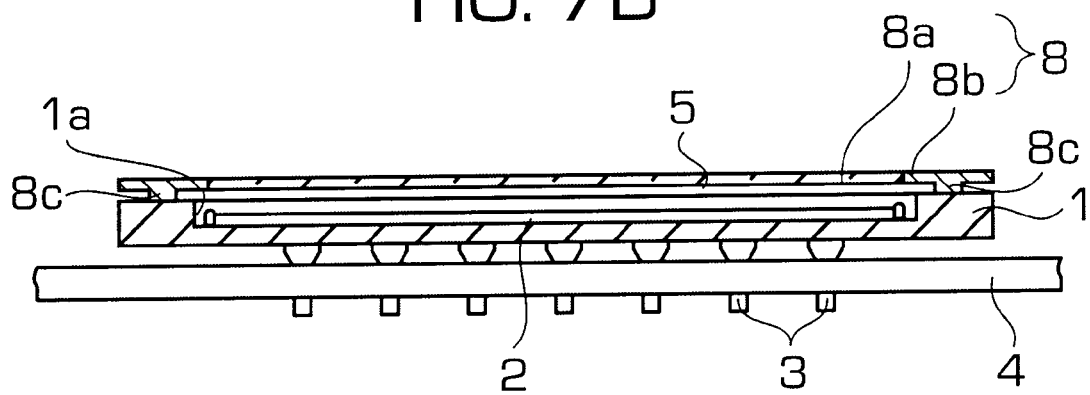
FIG. 7B is a front sectional view showing the fourth embodiment according to the present invention.

Referring to FIG. 7A and FIG. 7B, there is shown a fourth embodiment according to the present invention in which the constructions of package 1, CCD chip 2, and leads 3 are identical to those in the prior art and those of the first, second and third embodiments.

Cap 8 in this embodiment consists of a transparent portion 8a at a position facing to CCD chip 2 and an opaque portion 8b which is a portion other than the transparent portion 8a. Like package 1, opaque portion 8b is made of plastic in which impurities such as filler or carbon are mixed and has a small thermal expansion coefficient. On the other hand, the transparent portion 8a is made only of a plastic material without impurities mixed therein and has a large thermal expansion coefficient. Cap 8 has an inner side surface (surface bonded to the package 1) on which a projection 8c in a ring shape surrounding the outside of the recess portion 1a. Cap 8 is bonded to the package 1 only at this projection 8c.

When the semiconductor device is mounted on printed circuit board 4 and immersed into the molten solder bath at a high temperature, the heat is transmitted from the leads 3 to the package 1, and further transmitted from the package 1 to the cap 8. In the case of the prior art shown in FIGS. 1A, 1B and 1C, since the heat is transmitted though the entire surfaces of the package and the cap except the recess portion, the heat is easily transmitted between both and the temperature of the cap is increased to substantially the same temperature as that of the package.

In contrast, in the case of this embodiment, since only projection 8c serves as a heat transmission path, the efficiency of the heat transmission from the package 1 to the cap 8 is low. So the temperature of cap 8 does not become so high as that of the package 1. As described above, although the transparent portion 8a of the cap 8 has a large thermal expansion coefficient, the deformation is reduced if an increase in temperature is small. Specifically, in this embodiment, a large increase in temperature occurs in the package 1 and the printed circuit board 4 having a small thermal expansion coefficient exert, while a small increase in temperature occurs in the cap 8 having a large thermal expansion coefficient, so that the deformation of both are substantially the same and so large warp does not occur.

Like the second and third embodiments, in this embodiment, the volume of transparent portion 8a having a large thermal expansion coefficient is small so that the total of the force which tends to thermally deform the transparent portion 8a is small and the force exerting on the package 1 is small. Also, since the volume of the transparent portion 8a is small, the rate of the impurities in the plastic material of the entire semiconductor device so that an apparent thermal expansion coefficient of the entire semiconductor device is smaller and closer to the thermal expansion coefficient of printed circuit board 4. This is also because an amount of warp of the semiconductor device according to this embodiment is small.

Figure 8A:
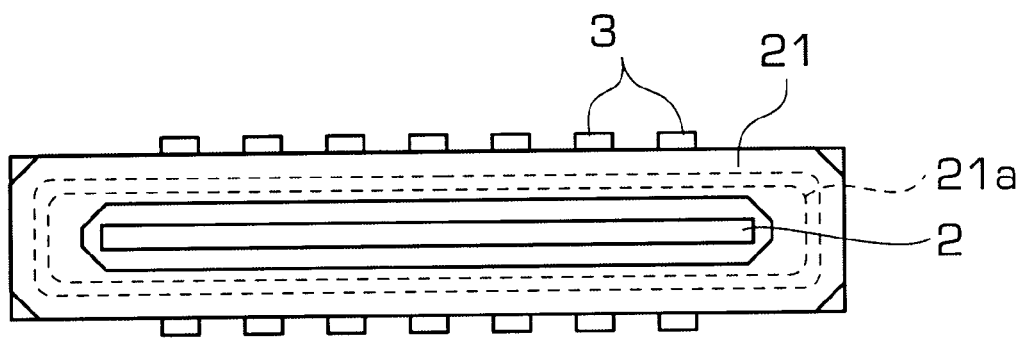
FIG. 8A is a plan view showing a variant of the fourth embodiment according to the present invention.
Figure 8B:
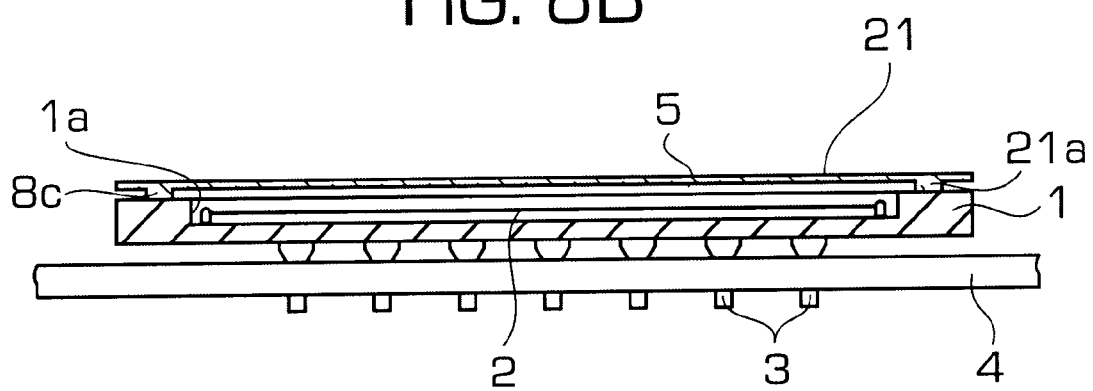
FIG. 8B is a front view showing the example of another variant of the fourth embodiment according to the present invention.

It should be noted that as shown in FIG. 8A and FIG. 8B, the effect of suppressing the warp of the cap 8 and the entire semiconductor device in the longitudinal direction may also be obtained through the configuration in which projection 21a is formed in the entirely transparent cap 21.

Figure 9:
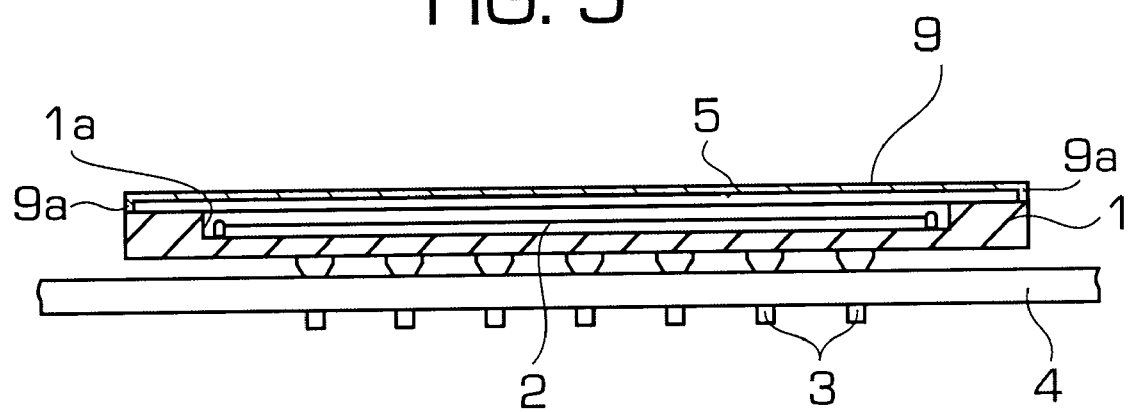
FIG. 9 is a front sectional view showing a fifth embodiment according to the present invention.

Referring to FIG. 9, there is shown a fifth embodiment according to the present invention in which a projection 9a is formed at the outermost periphery of the cap 9. Therefore, the manufacturing process of cap 9 is simpler and the strength of the cap 9 is increased.

While preferred embodiments of the present invention have been described using specific terms, such description is for illustrative purposes only, and it is to be understood that change and variations may be made without departing from the spirit or scope of the following claims.

What is claimed:

1. A semiconductor device comprising:
   an opaque package made of a plastic and having a recess portion on the upper surface thereof;
   a semiconductor element contained in said recess portion; and
   a transparent cap made of plastic and fixed to the upper surface of said package so as to cover said recess portion and having a thickness of 0.5 mm or less.

2. The semiconductor device according to claim 1, wherein said semiconductor element is a CCD chip.

3. The semiconductor device according to claim 1, wherein the bottom surface of said package is mounted to a printed circuit board.

4. A semiconductor device comprising:
   an opaque package made of plastic and having a recess portion on the upper surface thereof;
   a semiconductor element contained in said recess portion; and
   a transparent cap made of plastic and fixed to the upper surface of said package so as to cover said recess portion and having grooves formed thereon in a direction substantially perpendicular to the longitudinal direction.

5. The semiconductor device according to claim 4, wherein said semiconductor element is a CCD chip.

6. The semiconductor device according to claim 4, wherein the bottom surface of said package is mounted to a printed circuit board.

7. A semiconductor device comprising:
   an opaque package made of plastic and having a recess portion on the upper surface thereof;
   a semiconductor element contained in said recess portion; and
   a transparent cap made of plastic and fixed to the upper surface of said package so as to cover said recess portion, said transparent cap having projections from the outside of said recess portion and bonded to the upper surface of said package.

8. The semiconductor device according to claim 7, wherein said semiconductor element is a CCD chip.

9. The semiconductor device according to claim 7, wherein the bottom surface of said package is mounted to a printed circuit board.

10. The semiconductor device according to claim 7, wherein the projection is formed in a ring shape surrounding the outside of said recess portion.

11. The semiconductor device according to claim 10, wherein said semiconductor element is a CCD chip.

12. The semiconductor device according to claim 10, wherein the bottom surface of said package is mounted to a printed circuit board.

13. A semiconductor device comprising:
    an opaque package made of plastic and having a recess portion on the upper surface thereof;
    a semiconductor element contained in said recess portion; and
    a transparent cap made of plastic and fixed to the upper surface of said package so as to cover said recess portion and having a transparent portion facing said semiconductor element in said recess portion and an opaque portion at a position other than said transparent portion.

14. The semiconductor device according to claim 13, wherein said semiconductor element is a CCD chip.

15. The semiconductor device according to claim 13, wherein the bottom surface of said package is mounted to a printed circuit board.

16. The semiconductor device according to claim 13, wherein the thickness of said transparent portion is 0.5 mm or less.

17. The semiconductor device according to claim 16, wherein said semiconductor element is a CCD chip.

18. The semiconductor device according to claim 16, wherein the bottom surface of said package is mounted to a printed circuit board.

19. The semiconductor device according to claim 16, wherein said cap has grooves formed thereon in direction substantially perpendicular to the longitudinal direction.

20. The semiconductor device according to claim 19, wherein said semiconductor element is a CCD chip.

21. The semiconductor device according to claim 19, wherein the bottom surface of said package is mounted to a printed circuit board.

22. The semiconductor device according to claim 13, wherein said cap has a projection from the outside of said recess portion and the projection is bonded to the upper surface of said package.

23. The semiconductor device according to claim 22, wherein said semiconductor element is a CCD chip.

24. The semiconductor device according to claim 22, wherein the bottom surface of said package is mounted to a printed circuit board.

25. The semiconductor device according to claim 22, wherein the projection is formed in a ring shape surrounding the outside of said recess portion.

26. The semiconductor device according to claim 22, wherein said semiconductor element is a CCD chip.

27. The semiconductor device according to claim 22, wherein the bottom surface of said package is mounted to a printed circuit board.

* * * * *